United States Patent
Forlenza et al.

(10) Patent No.: US 7,117,415 B2
(45) Date of Patent: Oct. 3, 2006

(54) AUTOMATED BIST TEST PATTERN SEQUENCE GENERATOR SOFTWARE SYSTEM AND METHOD

(75) Inventors: Donato O. Forlenza, Hopewell Junction, NY (US); Orazio P. Forlenza, Hopewell Junction, NY (US); William J. Hurley, Poughkeepsie, NY (US); Bryan J. Robbins, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 345 days.

(21) Appl. No.: 10/757,781

(22) Filed: Jan. 15, 2004

(65) Prior Publication Data

US 2005/0160339 A1 Jul. 21, 2005

(51) Int. Cl.
*G01R 31/28* (2006.01)
*G06F 11/00* (2006.01)

(52) U.S. Cl. .................................. 714/733; 714/736
(58) Field of Classification Search .................. None
See application file for complete search history.

(56) References Cited

U.S. PATENT DOCUMENTS

| | | | |
|---|---|---|---|
| 5,951,705 A * | 9/1999 | Arkin et al. ............. | 714/738 |
| 6,282,134 B1 * | 8/2001 | Kumar ..................... | 365/201 |
| 6,323,639 B1 * | 11/2001 | Park ......................... | 324/158.1 |
| 2002/0188902 A1 * | 12/2002 | Fan et al. ................. | 714/724 |

* cited by examiner

*Primary Examiner*—Phung My Chung
(74) *Attorney, Agent, or Firm*—Patterson & Sheridan, LLP

(57) ABSTRACT

Methods and systems for reducing the volume of test data associated with built in self testing (BIST) test methodologies (e.g., logical BIST, array BIST, etc.) and pattern structures are provided. Embodiments of the present invention store a limited number of "dynamic" test parameters for each test sequence that have changed relative to a previous test sequence.

18 Claims, 6 Drawing Sheets

| SEQ | PARAMETER VALUE TABLE | |
|---|---|---|
| | DYNAMIC TEST PARAMETERS | SIGNATURES |
| SEQ1 | SEEDS, CLOCK SETUP, WEIGHTS, | SIG1 |
| SEQ2 | CLOCK SETUP | SIG2 |
| SEQ3 | WEIGHTS | SIG3 |
| ⋮ | ⋮ | ⋮ |
| SEQN | SEEDS | SIGN |

FIG. 4

AUTOMATED BIST TEST PATTERN SEQUENCE GENERATOR SOFTWARE SYSTEM AND METHOD

BACKGROUND OF THE INVENTION

1. Field of the Invention

The present invention generally relates to integrated circuit devices and, more particularly to testing such devices.

2. Description of the Related Art

Advances in integrated circuit (IC) technology have given rise to IC devices with complex circuitry with hundreds of thousands of logic gates and operating frequencies in excess of 1 GHz. As the circuit complexity of a device increases, so does the need to thoroughly test the circuits. A general solution to the problem of testing integrated circuits is to embed test circuitry, commonly referred to as "Logic Built in self test" (LBIST) circuitry, on the chip itself.

FIG. 1 illustrates a conventional test system 100 including a tester 110 and a device under test (DUT) 120, such as an IC fabricated on a wafer 111, containing LBIST circuitry 130, shown in greater detail in FIG. 2. The tester 110 generally includes any suitable combination of software and hardware configured to initiate LBIST test sequences on the device 120, via an interface 113 (e.g., pins/pads of the device 120). As illustrated, the tester 110 may include test execution software 112 and a set of test data 114 defining a set of test sequences 115. For example, each test sequence 115 may be defined by a set of operations 116 and corresponding data 118 to configure the LBIST circuitry 130 to test the device 120 for a particular type of fault.

As illustrated in FIG. 2, the LBIST circuitry 130 typically includes a pseudo random pattern generator (PRPG) 132 designed to generate test patterns to be applied to inputs of scan chains 134 formed in the circuitry under test 136 and a multiple-input signal register (MISR) 138 to receive signals output from the scan chains 134. An LBIST controller (not shown) generates all necessary waveforms for repeatedly loading pseudorandom patterns from the PRPG into the scan chains 134, initiating a functional cycle (capture cycle), and logging output responses into the MISR 138. The MISR 138 compresses accumulated responses (from multiple cycles) into a code referred to as a signature. Any corruption in the final signature at the end of the test sequence indicates a defect in the device 120. The illustrated LBIST architecture is known as a STUMPS architecture ("Self-test using MISR and Parallel Shift register sequence generator). Such an architecture is described in detail in the commonly owned U.S. Pat. No. 4,503,537, entitled "Parallel Path Self-testing System."

The scan chains 134 are formed of shift register latches (SRLs) that allow data to be loaded and unloaded in parallel (during a scan mode) to initialize and examine internal circuits that are not externally accessible. During initialization of a test sequence 115 or a portion of a test sequence 115, the tester may load data 118 into one or more of the scan chains 134 via shift register inputs (SRIs) 135, for example, to initialize internal circuitry of the device 120 and/or initialize the PRPG 132 with an initial or "seed" value. At the end of a test sequence 115, the tester may unload data, such as the state of the internal circuitry from the scan chains 134 or a signature from the MISR 138, via one or more shift register outputs (SROs) 137. Signatures unloaded from the MISR 138 at the end of a test sequence 115 may be compared against known good signatures 117 corresponding to that test sequence 115 to detect a fault in the device 120.

While such LBIST circuitry continues to serve the IC industry well, as the number of circuit components increase, designing a set of test sequences 115 that provides adequate assurance that a large percentage of all possible faults are being tested for (commonly referred to as test coverage) becomes increasingly difficult. To ensure adequate test coverage, the number of test sequences 115 is typically increased. For example, there are typically several types or modes of tests (static tests to detect stuck-on/off components, dynamic tests to detect timing related faults, etc.), with several test sequences 115 performed for each type of test resulting in hundreds of test sequences 115. For example, the number of clock cycles may be varied (e.g., from 1 to 8) and/or the number of iterations or "loop count" may be varied (e.g., from 32 to 1 M) each test sequence.

As illustrated, each test sequence 115 may include several full length shift register latch loads. As complex ICs, such as modern micro-processors, may include several hundred-thousand latches, the volume of the test data 114 may quickly grow unwieldy (e.g., several GB). The large volume of the test data 114 may increase test time due to large test data volume transfer and execution, as well as the need for buffer reloading due to buffer size limitations at the tester, which may degrade test throughput and increase test and overall device cost.

Accordingly, a need exists for an improved method and system for performing LBIST testing, preferably that reduces the volume of test data while maintaining adequate test coverage.

SUMMARY OF THE INVENTION

The present invention generally provides methods and systems for reducing the volume of test data required to define a set of BIST test sequences.

One embodiment provides a BIST method for testing a device. The method generally includes maintaining, in memory, a current set of test parameters corresponding to a current test sequence being run or previously run and, for each of a plurality of subsequent test sequences to be run after the current test sequence: obtaining dynamic test parameters indicating a change in test parameters corresponding to the subsequent test sequence relative to the current set of test parameters, updating the current set of test parameters based on the dynamic test parameters, configuring the device with updated current set of test parameters, and performing the subsequent test sequence.

Another embodiment provides a method for generating test data for use in sequentially running a set of test sequences on a device. The method generally includes obtaining test parameters corresponding to each test sequence and generating a table comprising, for each of a plurality of the test sequences, a set of dynamic test parameters indicating a change in test parameters relative to a previous test sequence.

Another embodiment provides a computer-readable medium containing a program for built in self testing of a device. When executed, the program performs operations generally including maintaining a current set of test parameters corresponding to a current test sequence being run or previously run and, for each of a plurality of subsequent test sequences to be run after the current test sequence: obtaining dynamic test parameters indicating a change in test parameters corresponding to the subsequent test sequence relative to the current set of test parameters, updating the current set of test parameters based on the dynamic test parameters, configuring the device with updated current set of test parameters, and performing the subsequent test sequence.

Another embodiment provides a system for performing a plurality of test sequences on a device generally including a set of current test parameters maintained in memory, a table containing, for each of a plurality of test sequences, dynamic test parameters indicating a change in test parameters relative to a previous test sequence, and an executable component. The executable component is generally configured to perform the test sequences by obtaining, from the table, the dynamic test parameters corresponding to a test sequence to be run, modifying the set of current test parameters based on the obtained dynamic test parameters, configuring the device with the modified current set of test parameters, and performing the test sequence.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 illustrates an exemplary parameter value table in accordance with one embodiment of the present invention.

DETAILED DESCRIPTION OF THE PREFERRED EMBODIMENTS

Figure 1:
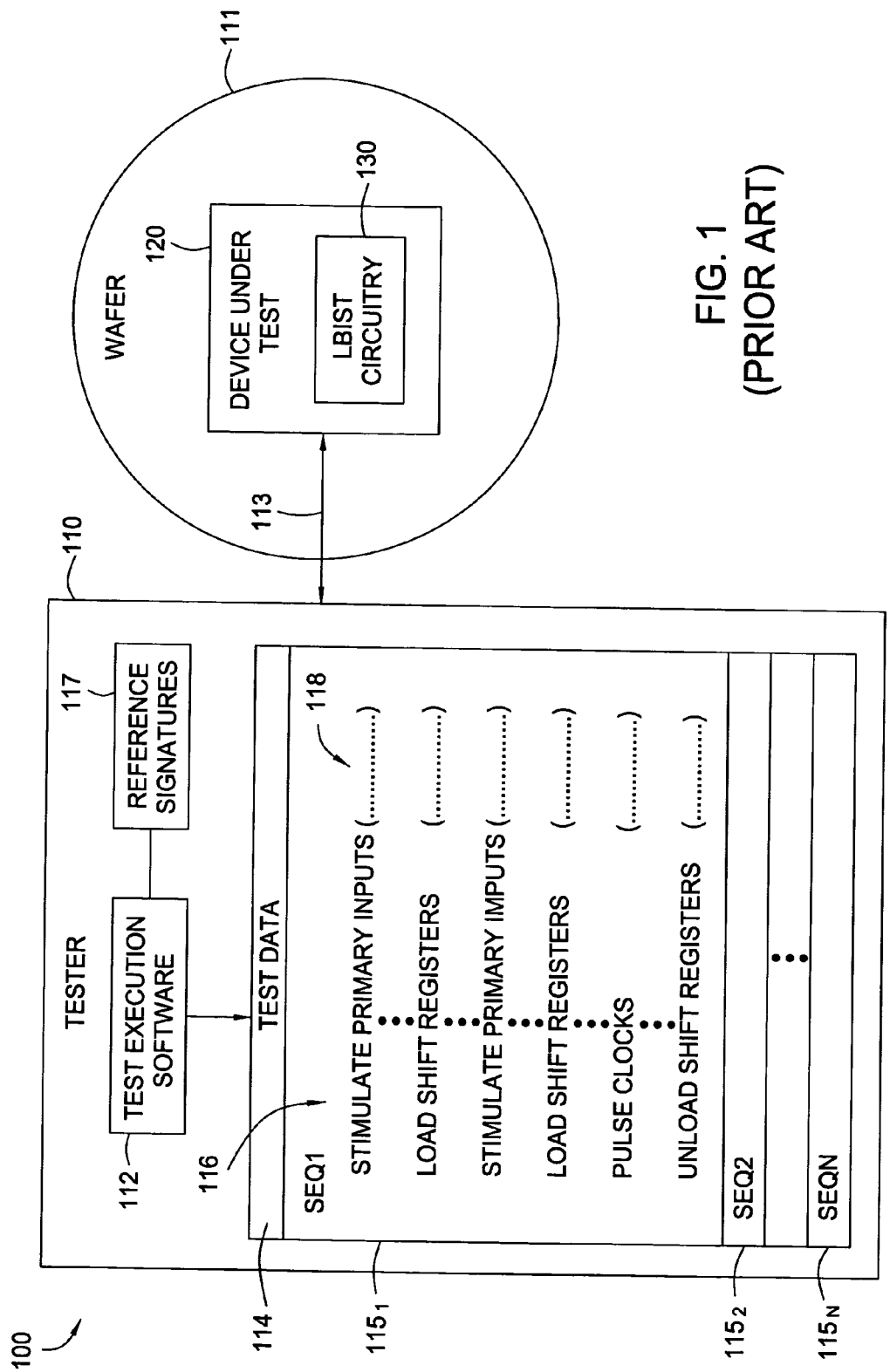
FIG. 1 illustrates a conventional system for testing a device with logical built-in self test (LBIST).
Figure 2:
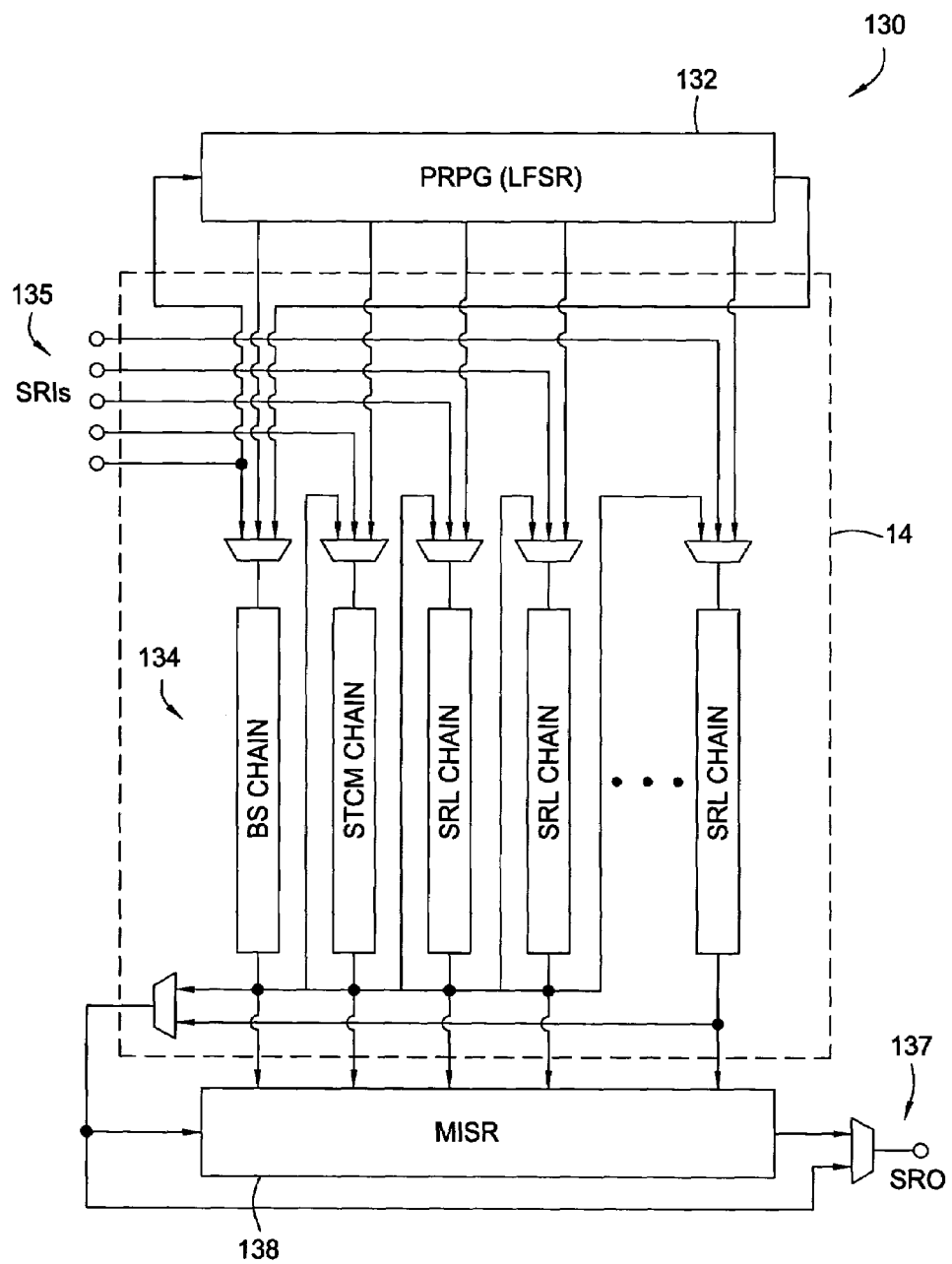
FIG. 2 illustrates exemplary logical built-in self test (LBIST) circuitry.

Embodiments of the present invention may be utilized to reduce the volume of test data associated with built in self testing (BIST) test methodologies (e.g., logical BIST, array BIST, etc.) and pattern structures. Rather than store the entire set of test parameters for each test sequence, as with conventional test systems, embodiments of the present invention only store a limited number of "dynamic" test parameters for each test sequence that have changed relative to a previous test sequence. For many test sequences (e.g., of a common test type) relatively few test parameters (latch settings) may change (e.g., loop count or number of clock cycles). By only storing the test parameters for each test sequence that have changed relative to a previous test sequence, a significant amount of redundant data may be eliminated from the test data, thereby reducing the volume of test data significantly.

As used herein, the term dynamic test parameters generally refers to test parameters for a given test sequence that have changed relative to another (e.g., a previous) test sequence. While test data volume may be reduced by storing dynamic test parameters, for example, if a group of tests share common latch settings, the time required for device configuration may not be reduced, as the latch settings may still require a full load. It should be understood that the amount of dynamic test data may vary substantially from one test sequence to another, for example, when all new initial latch settings are required. Further, in order to facilitate understanding, embodiments of the present invention will be described with reference to LBIST testing of IC devices as an illustrative, but not limiting, application example. It should be understood, however, that certain aspects of the present invention may be readily applied to other types of testing, such as array (memory) built in self testing (BIST), algorithmic built in self testing, and may also be adapted to testing higher level package structures such as multi-chip modules (MCMs) and are usable in system test environments.

Embodiments of the invention may be implemented as a program product for use with a tester, for example, in the test system 300 shown in FIG. 3 and described below. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

An Exemplary Test System

Figure 3:
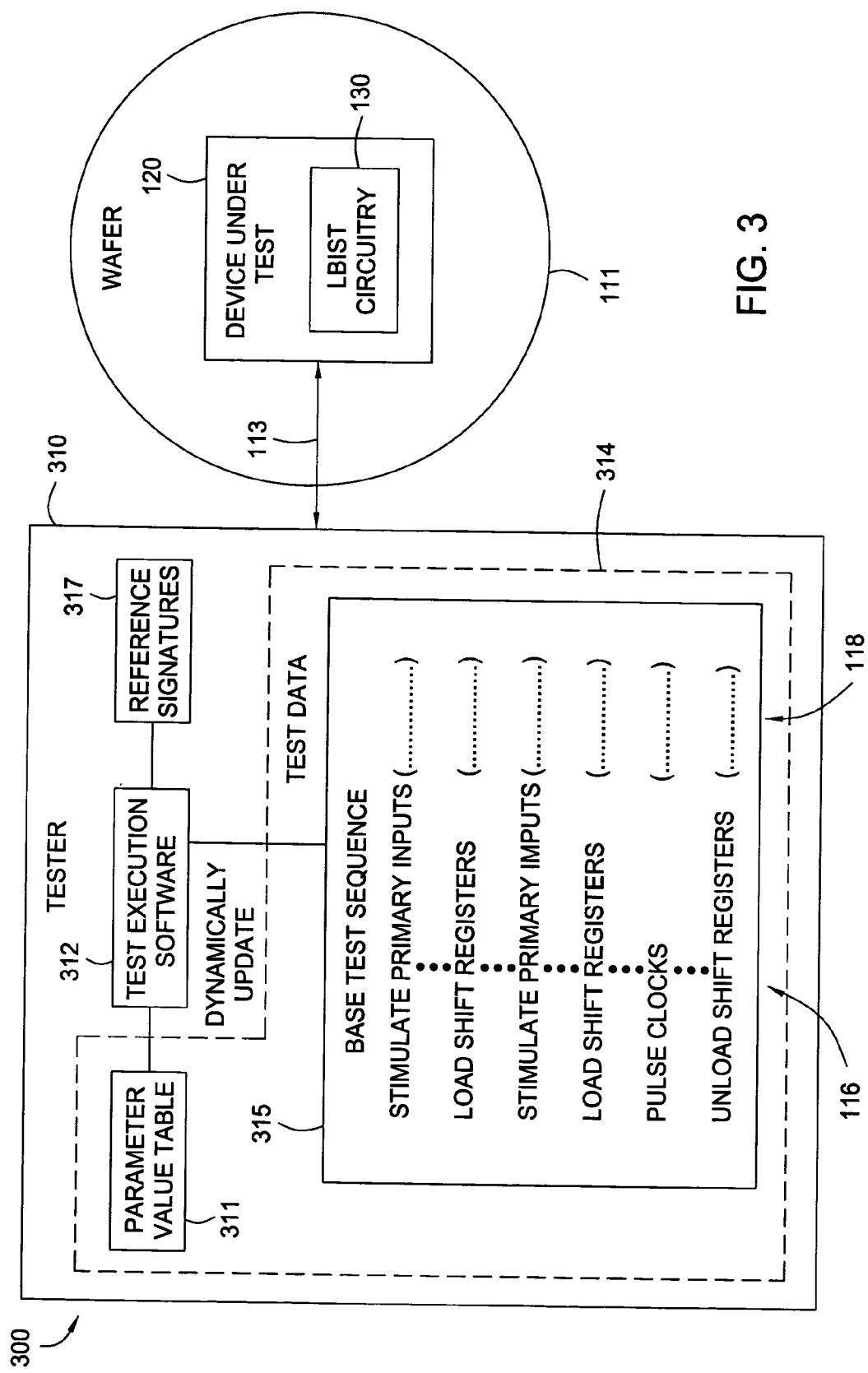
FIG. 3 illustrates a system for testing a device with LBIST circuitry in accordance with one embodiment of the present invention.

FIG. 3 illustrates an exemplary system 300 with a tester 310 for testing a device 120 with LBIST circuitry 130 in accordance with one embodiment of the present invention. As previously described, the device 120 may be one of many such devices on a wafer 111, any or all of which may be tested by the tester 310. As illustrated, rather than store all the data (test parameters) for an entire set of test sequences, a single base test sequence 315 may be stored on the tester 310. The base test sequence 315 may be used as a template or "protocol" structure, to define various configuration data, constant parameters, setups, and vectors needed to configure and perform a basic LBIST test for the device 120, with such data being constant among test sequences.

The variable parameters used for each test sequence, however, may be stored in a parameter value table 311. When testing a device, test execution software 312 may continually update current settings (initially derived from the base test sequence 315), with dynamic test parameters from the parameter value table 311, in order to perform different test sequences. In order to perform a current test sequence, the test execution software 312 may modify the test parameter settings for a previous sequence, based on the dynamic test parameters stored in the parameter value table 311 for a subsequent test sequence. The test execution software 312 may then load the test parameter settings to the device 120 (e.g., via a shift register latch load) and perform the current test, as with conventional systems.

However, by storing only the test parameter settings that change from one test sequence to the next in the parameter value table 311, the total volume of test data 314 required to define a desired set of test sequences may be reduced significantly. For example, in some cases, test parameters for a set of test sequences conventionally requiring approximately 2 GB when explicitly defining each sequence may only require 1 GB when using a parameter value table. As shown in FIG. 4, the parameter value table 311 may be a implemented simple table that defines LBIST parameter settings (e.g., by specifying latch positions and respective values/settings) as dynamic data 312 for each test sequence 314 to be performed while testing the device 120.

As illustrated, the amount and type of dynamic test parameters 313 for each sequence 312 may vary depending, of course, on the previous sequence. For example, the test parameters for second sequence (SEQ2) shown in the parameter value table 311 illustratively differ from those of the first sequence (SEQ2) by clock setup parameters. In other words the second test sequence may otherwise utilize the same parameters as the first test sequence (e.g., PRPG seed value, latch weights, etc.). Similarly, the test parameters for the third sequence may differ from those of the second sequence by latch weight parameters. In either case, the amount of data required to define a test sequence relative to the previous sequence represents a small fraction of the total test parameters, thus reducing test data volume substantially.

While rather simple types and number or parameters were shown as dynamic test parameters 313 in FIG. 4, for illustrative purposes, one skilled in the art will recognize the dynamic test parameters 313 may actually include a relatively large number of different parameter types, and will likely vary with the type and design of the device 120 being tested. Examples of the types of parameters that may be included as dynamic test parameters 313 include, but are not to Pseudo Random Pattern Generator (PRPG) initial seeds, Multiple Input Signature Register (MISR) initial seeds, sequence type registers (1-N system clocks), On Product Clock Generation (OPCG) settings, PLL settings, latch weight settings (e.g., to generate patterns that have more 1's or 0's), selective signature generation (SSG) settings, Self Test Control Macro settings, and the like.

For some embodiments, the parameter value table 311 may be generated in a manner designed to minimize the total volume of dynamic test parameters 313 and, thus overall test data 314. For example, once a set of desired test sequences (and corresponding parameter settings) to be performed for a given device is identified, an algorithm may be run that determines an optimum order in which the test sequences should be run in an effort to minimize the total volume of the parameter value table 311. The algorithm may try several different orders, log the total volume for each, and select an order resulting in the smallest volume.

Figure 5:
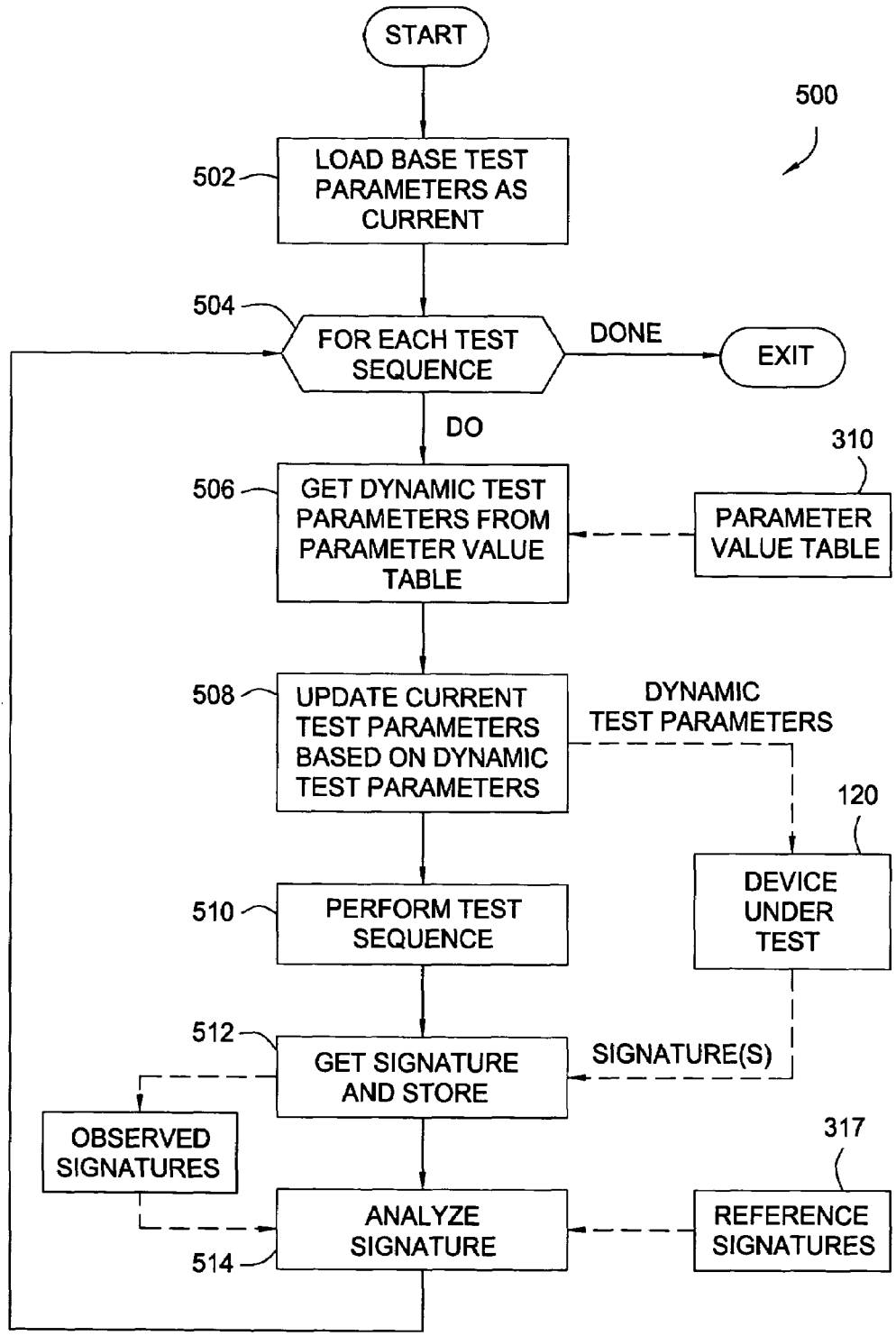
FIG. 5 is a flow diagram of exemplary operations for testing a device with LBIST circuitry in accordance with one embodiment of the present invention.

Operation of the test system 300 may be described with reference to FIG. 5 which illustrates exemplary operations 500 that may be performed, for example, by the test execution software 312. The operations 500 begin, at step 502, by loading the (initial) test parameters for the base test sequence as current test parameters. At step 504, a loop of operations (506–514) to be performed for each test sequence is entered. At step 506, the dynamic test parameters for the (next) test sequence are retrieved (e.g., from the parameter value table 311) and, at step 508, the current test parameters are updated based on the dynamic test parameters retrieved for the next test to be run. The test execution software 312 may maintain a current set of test parameters that is modified and loaded to the device 120 in to perform each new test sequence.

At step 510, the test sequence is performed and, at step 512, a resulting signature is obtained from the device (e.g., via a latch unload operation) and stored. At step 514, the signature obtained is analyzed (e.g., compared against a reference signature) to determine if the device 120 generated any faults during the test sequence. Even if a fault is detected, the operations 506–514 are typically repeated for each test sequence, in order to gather more insight (e.g., to determine if a device 120 fails only one type of test or different types). Once each test sequence has been performed, the operations 500 are exited.

Reference Signature Generation

For some embodiments, reference signatures 317 used to determine if a device 120 has passed a particular set of test sequences may be generated by "good machine" simulation. For example, automatic test pattern generation (ATPG) software may be used to simulate internal circuitry of a "good" device and generate an expected signature given a particular set of test parameters. However, as the number of devices increases, this device simulation may become increasingly complex and time consuming (several days), particularly for test sequences with higher (e.g., >4k) loop counts. Longer simulation times delay the release of test patterns, test sequence delivery and, thus, the debug of early user hardware, which can have a direct impact on time to market.

Figure 6:
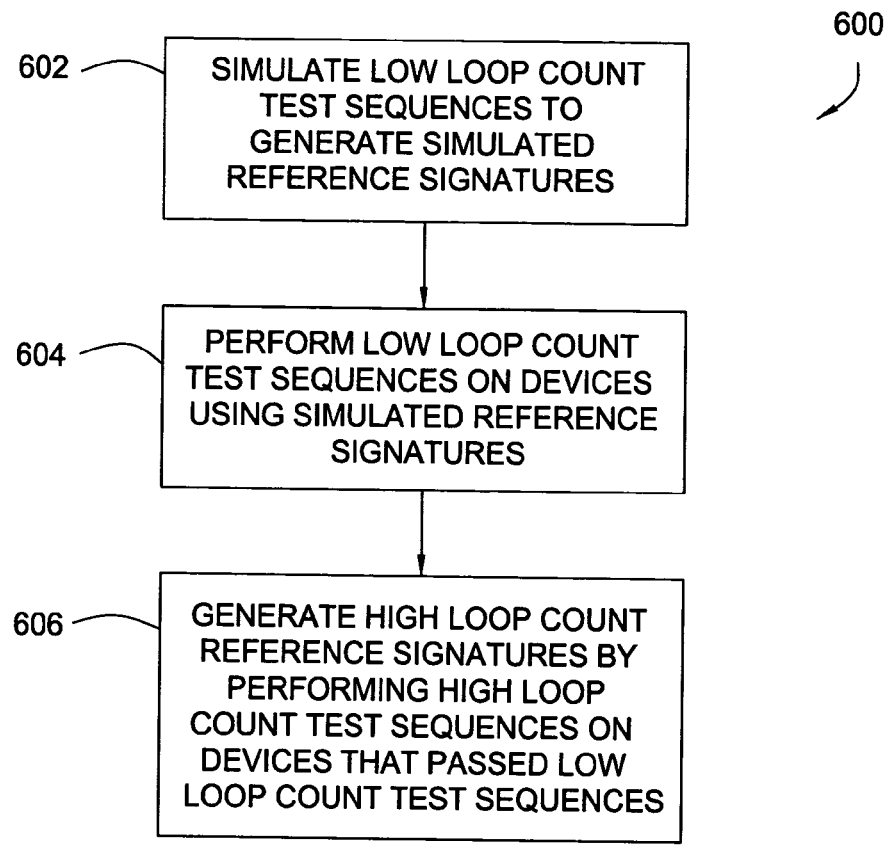
FIG. 6 is a flow diagram of exemplary operations for generating high loop count test sequence reference signatures in accordance with one embodiment of the present invention.

One approach to speed the development of reference signatures for higher loop count test sequences is to actually generate, define, and save good output response signatures from actual devices, for example, that passed a set of lower loop count (e.g., <4k) test sequences. FIG. 6 illustrates exemplary operations 600 for generating reference signatures using a hybrid approach, of sorts, utilizing a combination of device simulation and actual device testing.

The operations 600 begin, at step 602, by simulating low loop count test sequences to generate simulated reference signatures. The simulation time may not be too high for the low loop count. The same low loop count test sequences are then performed on an actual device, at step 604, using the simulated reference signatures for comparison against observed signatures. Devices passing the low loop count test sequences may be considered good and may be used, at step 606, to generate reference signatures for high loop count test sequences. Multiple "good" devices may be used in an effort to raise confidence.

For example, high loop count test sequences may be performed on the good devices (typically much faster than simulation), and the observed signatures may be used as reference signatures when performing the high loop count test sequences on other devices. This approach may significantly reduce or eliminate the dependence on simulation for higher count test loop sequences, which may significantly speed the release of test sequences. One skilled in the art will appreciate that the particular lower loop test sequences used to generate the simulated reference signatures may be optimized to increase the assurance that devices that pass those tests are good devices and likely to pass the higher loop count test sequences, as well. However, such optimizations are beyond the scope of the present application.

Figure 7:
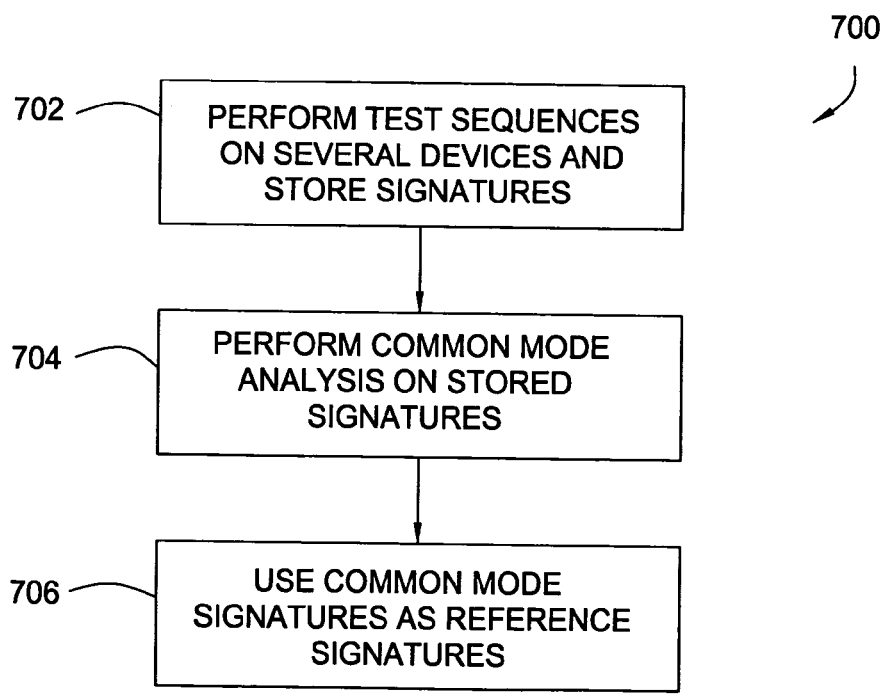
FIG. 7 is a flow diagram of exemplary operations for generating reference signatures in accordance with one embodiment of the present invention.

FIG. 7 illustrates another approach to reduce the dependence on simulation, by analyzing the response signatures for test sequences performed on a collection of devices, such as all the ICs on a wafer. The operations 700 of FIG. 7 begin, at step 702, by performing a set of test sequences on several devices and storing the response signatures from each of the devices. The testability heuristics used may be to apply a pre-determined number of loops per test sequence type per test mode based upon the random resistance of the structure, which can be obtained using readily available random resistance analysis tools. At step 704, common mode signature analysis is performed on the stored response signatures, for example, to identify a common response signature obtained from a majority of the devices for each test sequence. At step 706, signatures identified by the common mode signature analysis are used as reference signatures for subsequent devices tested using the test sequences.

Thus, using the approach illustrated in FIG. 7, reliance on simulation may be eliminated entirely. For some embodiments, the approaches illustrated in FIG. 6 and FIG. 7 may be combined. For example, common mode analysis approach illustrated in FIG. 6 may be used to confirm or verify the high count test sequence reference signatures obtained utilizing the approach illustrated in FIG. 6.

Alternative Embodiments

Those skilled in the art will recognize that aspects of the present invention may be extended beyond the external tester and LBIST application described above. For example, aspects of the present invention may be applied to a fully integrated, automated BIST test pattern sequence generator on a device. For example, system memory (e.g., external to the device or embedded arrays on the device) may be utilized to provide temporary storage for the parameter value table 311.

During a self-test mode, the memory can be loaded with the desired set of parameters to perform a self-contained LBIST test from the test system and then set the memory in a loop fashion to apply as many LBIST test patterns as required. This could be further repeated for all LBIST test sequences with multiple sets of parameters. On-chip hardware could provide the necessary sequencing and can be controlled by BIST (e.g., logical or array BIST) circuitry running at system speeds. To be completely self-contained on-chip, the minimum size of the memory would be determined by the number of unique LBIST test sequences desired to test the device. However, if memory reloading is a viable option (e.g., under control of test execution software running on the device), the memory does not have to hold the dynamic test parameters for all the test sequences in a single pass.

CONCLUSION

Aspects of the present invention may be utilized to reduce the volume of test data required to define a series of BIST test sequences by storing, for each test sequence, only those "dynamic" test parameters that have changed relative to a previous test sequence. A maintained set of test parameters corresponding to a current (or previously run) test sequence may then be modified based upon dynamic test parameters for subsequent test sequences.

While the foregoing is directed to embodiments of the present invention, other and further embodiments of the invention may be devised without departing from the basic scope thereof, and the scope thereof is determined by the claims that follow.

What is claimed is:

1. A built in self test (BIST) method for testing a device, comprising:
   maintaining, in memory, a current set of test parameters corresponding to a current test sequence being run or previously run; and
   for each of a plurality of subsequent test sequences to be run after the current test sequence:
      obtaining dynamic test parameters indicating a change in test parameters corresponding to the subsequent test sequence relative to the current set of test parameters,
      updating the current set of test parameters based on the dynamic test parameters,
      configuring the device with updated current set of test parameters, and
      performing the subsequent test sequence.

2. The method of claim 1, wherein obtaining the dynamic test parameters comprises retrieving the dynamic test parameters from a table listing dynamic test parameters for the subsequent test sequences.

3. The method of claim 1, wherein configuring the device with the updated current set of test parameters comprises loading the updated current set of test parameters to the device.

4. The method of claim 3, wherein loading the updated current set of test parameters to the device comprises loading shift register latches of the device.

5. The method of claim 1, wherein maintaining, in memory, the current set of test parameters comprises maintaining the current set of test parameters in memory external to the device.

6. The method of claim 1, wherein maintaining, in memory, the current set of test parameters comprises maintaining the current set of test parameters in an array of memory elements on the device.

7. The method of claim 1, further comprising:
   obtaining one or more response signatures after performing each subsequent test; and
   using obtained response signatures as reference signatures for testing subsequent devices.

8. The method of claim 1, further comprising:
   obtaining one or more response signatures after performing each subsequent test; and
   comparing the one or more response signatures to reference signatures to detect the occurrence of device faults, wherein the reference signatures comprise at least one signature generated by simulating running a test sequence on a device.

9. The method of claim 8, wherein the reference signatures further comprise at least one signature generated by running a test sequence on a device.

10. A computer-readable medium containing a program for testing a device which, when executed, performs operations comprising:
    maintaining a current set of test parameters corresponding to a current test sequence being run or previously run; and
    for each of a plurality of subsequent test sequences to be run after the current test sequence:
       obtaining dynamic test parameters indicating a change in test parameters corresponding to the subsequent test sequence relative to the current set of test parameters, updating the current set of test parameters based on the dynamic test parameters, configuring the device with updated current set of test parameters, and performing the subsequent test sequence.

11. The computer-readable medium of claim 10, wherein obtaining the dynamic test parameters comprises retrieving the dynamic test parameters from a table listing dynamic test parameters for the subsequent test sequences.

12. The computer-readable medium of claim 10, wherein the program is executed by the device.

13. A system for performing a plurality of test sequences on a device, comprising:

a set of current test parameters maintained in memory;

a table containing, for each of a plurality of test sequences, dynamic test parameters indicating a change in test parameters relative to a previous test sequence; and an executable component configured to perform the test sequences by obtaining, from the table, the dynamic test parameters corresponding to a test sequence to be run, modifying the set of current test parameters based on the obtained dynamic test parameters, configuring the device with the modified current set of test parameters, and performing the test sequence.

14. The system of claim 13, wherein:

the system further comprises a set of reference signatures; and the executable component is further configured to compare signatures obtained in response to running test sequences to reference signatures.

15. The system of claim 13, wherein the set of reference signatures are contained in the table.

16. The system of claim 13, wherein the executable component is configured to load the modified current set of test parameters on the device.

17. The system of claim 13, wherein at least one of the test sequences is a logical built in self test (LBIST) test sequence.

18. The method of claim 13, wherein the table is contained on the device.

* * * * *